United States Patent
Ye et al.

(10) Patent No.: US 10,571,501 B2
(45) Date of Patent: Feb. 25, 2020

(54) TECHNOLOGIES FOR VERIFYING A DE-EMBEDDER FOR INTERCONNECT MEASUREMENT

(71) Applicant: Intel Corporation, Santa Clara, CA (US)

(72) Inventors: Xiaoning Ye, Portland, OR (US); Kai Xiao, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 15/459,248

(22) Filed: Mar. 15, 2017

(65) Prior Publication Data

US 2017/0269136 A1    Sep. 21, 2017

Related U.S. Application Data

(60) Provisional application No. 62/309,190, filed on Mar. 16, 2016.

(51) Int. Cl.
  *G01R 27/28* (2006.01)

(52) U.S. Cl.
  CPC .................................. *G01R 27/28* (2013.01)

(58) Field of Classification Search
  CPC . G01R 27/28; G01V 3/10; G01V 3/15; G01V 3/165; G01V 3/104; G01V 3/26; G01V 3/34

(Continued)

(56) References Cited

U.S. PATENT DOCUMENTS

| 4,859,952 | A | * | 8/1989 | Wissell | .................. | G01R 31/04 |
|   |   |   |   |   |   | 324/538 |
| 4,870,356 | A | * | 9/1989 | Tingley | .................. | G01R 1/073 |
|   |   |   |   |   |   | 324/750.02 |

(Continued)

FOREIGN PATENT DOCUMENTS

EP    1569005    8/2005

OTHER PUBLICATIONS

International search report for PCT application No. PCT/US2017/022773, dated Jun. 26, 2017 (3 pages).

(Continued)

*Primary Examiner* — Jermele M Hollington
*Assistant Examiner* — Taqi R Nasir
(74) *Attorney, Agent, or Firm* — Barnes & Thornburg LLP

(57) ABSTRACT

Technologies for verifying a de-embedder for interconnect measurement include a verification compute device. The verification compute device is to measure a first signal transmitted through a single device under test and measure a second signal transmitted through a duplicated set of devices under test. Each device under test in the duplicated set is substantially identical to the single device under test. Additionally, the verification compute device is to apply a de-embedder to the measured first signal to remove an effect of test fixtures on the measured first signal, apply the de-embedder to the measured second signal to remove the effect of the test fixtures on the measured second signal, concatenate the de-embedded first signal with itself to generate a concatenated de-embedded first signal, and compare the concatenated de-embedded first signal with the de-embedded second signal to determine whether the concatenated de-embedded first signal matches the de-embedded second signal.

28 Claims, 7 Drawing Sheets

(58) Field of Classification Search
USPC ....... 324/615, 314, 329, 332, 637, 639, 136, 324/311, 336, 337, 392, 757.02, 763.01; 716/16, 1, 4, 5, 14, 12, 13
See application file for complete search history.

(56) References Cited

U.S. PATENT DOCUMENTS

| | | | | | |
|---|---|---|---|---|---|
| 5,371,505 | A | * | 12/1994 | Michaels | H01Q 1/42 324/639 |
| 5,412,325 | A | * | 5/1995 | Meyers | G01R 29/26 324/613 |
| 5,430,383 | A | * | 7/1995 | Boos | G01R 27/2605 324/519 |
| 5,528,600 | A | * | 6/1996 | El Ayat | G01R 31/318516 324/750.3 |
| 5,672,966 | A | * | 9/1997 | Palczewski | G01R 31/318519 324/762.02 |
| 5,694,047 | A | * | 12/1997 | Goetting | G01R 27/205 257/530 |
| 5,834,945 | A | * | 11/1998 | Akram | G01R 1/0483 324/756.05 |
| 5,905,383 | A | * | 5/1999 | Frisch | G01R 31/2884 324/756.05 |
| 5,937,006 | A | * | 8/1999 | Clark | G01R 27/32 324/601 |
| 6,040,702 | A | * | 3/2000 | Hembree | G01R 1/0483 324/756.05 |
| 6,470,485 | B1 | * | 10/2002 | Cote | G01R 31/318519 324/613 |
| 6,674,293 | B1 | * | 1/2004 | Tsironis | H01P 5/04 324/637 |
| 7,034,548 | B2 | | 4/2006 | Anderson | |
| 7,439,748 | B2 | * | 10/2008 | Kamitani | G01R 27/28 324/601 |
| 7,865,319 | B1 | | 1/2011 | Jacobs et al. | |
| 2007/0073499 | A1 | | 3/2007 | Sawyer et al. | |
| 2009/0125279 | A1 | | 5/2009 | Fakterman | |
| 2011/0298476 | A1 | * | 12/2011 | Degerstrom | G01R 27/32 324/615 |

OTHER PUBLICATIONS

Written opinion for PCT application No. PCT/US2017/022773, dated Jun. 26, 2017 (4 pages).

* cited by examiner

TECHNOLOGIES FOR VERIFYING A DE-EMBEDDER FOR INTERCONNECT MEASUREMENT

CROSS-REFERENCE TO RELATED APPLICATIONS

The present application claims the benefit of U.S. Provisional Patent Application No. 62/309,190, filed Mar. 16, 2016.

BACKGROUND

With the increasing speeds of data transmissions through interconnects (i.e., printed circuit board (PCB) traces, cables, and other electrical conductors) used with modern compute devices, measurement of interconnects and their components has become challenging. Vector network analyzers, which characterize interconnects in terms of network scattering parameters (S-parameters), have become a popular tool to measure the performance of interconnects at relatively high frequencies. Making high quality measurements with a vector network analyzer is relatively straightforward when the interconnect being measured is a standard coaxial cable. However, when the interconnect is a trace on a PCB or other type of conductor, test fixtures are usually required to connect coaxial cables to the interconnect to enable the vector network analyzer to characterize the interconnect. The test fixtures have an effect on electrical signals transmitted through the interconnect. If the S-parameters of a reference interconnect are known, the effect caused by the test fixtures on a test signal transmitted through the reference interconnect can be identified, and a de-embedder can be created to remove the identified effect of the test fixtures. However, in some scenarios, a reference interconnect is not available.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
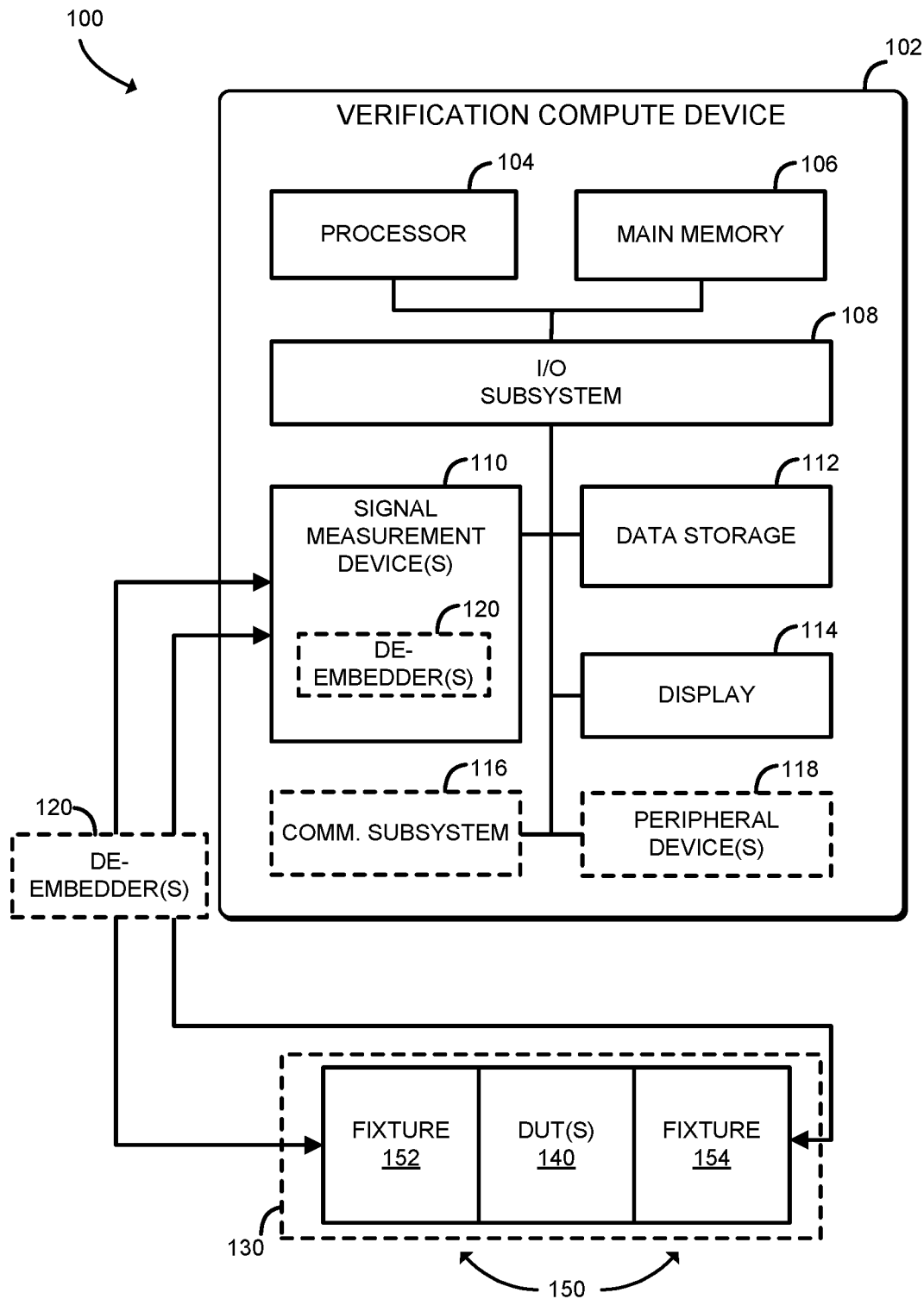
FIG. 1 is a simplified block diagram of at least one embodiment of a system for verifying a de-embedder using a verification compute device and a device under test.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative system 100 for verifying a de-embedder includes a verification compute device 102 coupled to a test kit 130. In some embodiments, one or more de-embedders 120, for removing an effect of the test fixtures on signal measurements, are coupled between the verification compute device 102 and the test kit 130. Additionally or alternatively, the one or more de-embedders 120 may be included in the verification compute device 102 and be embodied as one or more algorithms stored as computer-executable instructions in the verification compute device 102 or as specialized circuitry (e.g., a field programmable gate array (FPGA), an application specific integrated circuitry (ASIC), etc.) included in one or more components of the verification compute device 102, as described in more detail herein. The verification compute device 102 includes a processor 104, a main memory 106, an I/O subsystem 108, one or more signal measurement devices 110, and in at least some embodiments, the one or more de-embedders 120.

In use, as described in more detail herein, the verification compute device 102 is configured to transmit a test signal through the test kit 130, measure properties of the test signal, such as S-parameters, apply a de-embedder 120 to the measured signal, and determine whether the de-embedder correctly removed the effect of the test fixtures 150 from the measured signal so that only the properties of one or more device(s) under test (DUTs) (i.e., interconnect(s)) 140 are represented in the de-embedded signal. As described in more detail herein, the performance characteristics (e.g., S-parameters) of the DUTs 140 are not already known. In the illustrative embodiment, the verification compute device 102 is configured apply the de-embedder 120 to a first test signal transmitted through the test kit 130 with only a single DUT 140, then concatenate the resulting de-embedded signal with itself. Further, the illustrative verification compute device 102 is configured to apply the de-embedder 120 to a second test signal transmitted through the test kit 130 when the test kit 130 includes two DUTs 140 that are duplicates. The illustrative verification compute device 102 is further configured to determine whether the concatenated de-embedded signal matches (e.g., is equal to) the de-embedded signal associated with the duplicated DUTs 140. If so, the illustrative verification compute device 102 is configured to determine that the de-embedder 120 is verified (i.e., correctly removing the effect of the test fixtures 150 from the measured signals).

The verification compute device 102 may be embodied as any type of compute device capable of performing the functions described herein. For example, in some embodiments, the verification compute device 102 may be embodied as, without limitation, a computer, a desktop computer, a workstation, a server computer, a laptop computer, a notebook computer, a tablet computer, a smartphone, a distributed computing system, a multiprocessor system, a consumer electronic device, a smart appliance, and/or any other computing device capable of verifying a de-embedder as described herein. As shown in FIG. 1, the illustrative verification compute device 102 includes the processor 104, the main memory 106, the input/output subsystem 108, and the one or more signal measurement devices 110. Of course, the verification compute device 102 may include other or additional components, such as those commonly found in a desktop computer (e.g., various input/output devices), in other embodiments. Additionally, in some embodiments, one or more of the illustrative components may be incorporated in, or otherwise from a portion of, another component. For example, the memory 106, or portions thereof, may be incorporated in the processor 104 in some embodiments.

The processor 104 may be embodied as any type of processor capable of performing the functions described herein. For example, the processor may be embodied as a single or multi-core processor(s) having one or more processor cores, a digital signal processor, a microcontroller, or other processor or processing/controlling circuit. Similarly, the main memory 106 may be embodied as any type of volatile or non-volatile memory or data storage currently known or developed in the future and capable of performing the functions described herein. In operation, the main memory 106 may store various data and software used during operation of the verification compute device 102 such as signal data, de-embedder algorithms, operating systems, applications, programs, libraries, and drivers. The main memory 106 is communicatively coupled to the processor 104 via the I/O subsystem 108.

The I/O subsystem 108 may be embodied as circuitry and/or components to facilitate input/output operations with the processor 104, the main memory 106, and other components of the verification compute device 102. For example, the I/O subsystem 108 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 108 may form a portion of a system-on-a-chip (SoC) and be incorporated, along with the processor 104, the main memory 106, and other components of the verification compute device 102, on a single integrated circuit chip.

The one or more signal measurement devices 110 may be embodied as any type of circuitry and/or components capable of generating and transmitting test signals, measuring properties of the test signals when transmitted through one or more devices under test 140 (i.e., interconnect(s)), converting between analog and digital values, determining signal characteristics such as signal loss and reflection, and/or representing the signal characteristics in one or more formats (e.g., S-parameters, complex numbers, etc.).

The illustrative verification compute device 102 may also include a data storage device 112. The data storage device 112 may be embodied as any type of device or devices configured for short-term or long-term storage of data such as, for example, memory devices and circuits, memory cards, hard disk drives, solid-state drives, or other data storage devices. The data storage device 112 may store signal data, de-embedder algorithms, operating systems, applications, programs, libraries, and drivers, as described in more detail herein.

The illustrative verification compute device 102 may also include a display 114, which may be embodied as any type of display on which information may be displayed to a user of the verification compute device 102. The display 114 may be embodied as, or otherwise use, any suitable display technology including, for example, a liquid crystal display (LCD), a light emitting diode (LED) display, a cathode ray tube (CRT) display, a plasma display, and/or other display usable in a compute device. The display 114 may include a touchscreen sensor that uses any suitable touchscreen input technology to detect the user's tactile selection of information displayed on the display 114 including, but not limited to, resistive touchscreen sensors, capacitive touchscreen sensors, surface acoustic wave (SAW) touchscreen sensors, infrared touchscreen sensors, optical imaging touchscreen sensors, acoustic touchscreen sensors, and/or other type of touchscreen sensors.

The illustrative verification compute device 102 may additionally include a communication subsystem 116. The communication subsystem 116 may be embodied as one or more devices and/or circuitry for enabling communications with one or more remote devices over a network. The communication subsystem 116 may be configured to use any suitable communication protocol to communicate with other devices including, for example, wired data communication protocols, wireless data communication protocols, and/or cellular communication protocols.

The verification compute device 102 may additionally include one or more peripheral devices 118. Such peripheral devices 118 may include any type of peripheral device commonly found in a compute device such as speakers, a mouse, a keyboard, and/or other input/output devices, interface devices, and/or other peripheral devices.

The one or more de-embedders 120 may be embodied as circuitry or components capable of modifying characteristics of an input signal (i.e., a measured test signal). In some embodiments, rather than being embodied as hardware, the one or more de-embedders 120 are embodied as software or firmware included in a device, such as the verification compute device 102. As described in more detail herein, a correctly operating de-embedder 120 is configured to remove the effect that the test fixtures 150 have on the measured test signal, such that only the signal transmission properties of the one or more DUTs 140 are represented in the resulting de-embedded signal.

The illustrative test kit 130 includes one or more DUTs 140, such as traces on a printed circuit board (PCB) or other types of electrical conductors, coupled on both ends to test fixtures 150. The illustrative test fixtures 150 include a test fixture 152 and another test fixture 154. The test fixtures 150 enable the DUTs 140 to be coupled to the verification compute device 102 for analysis of the DUTs' 140 signal transmission characteristics.

Figure 2:
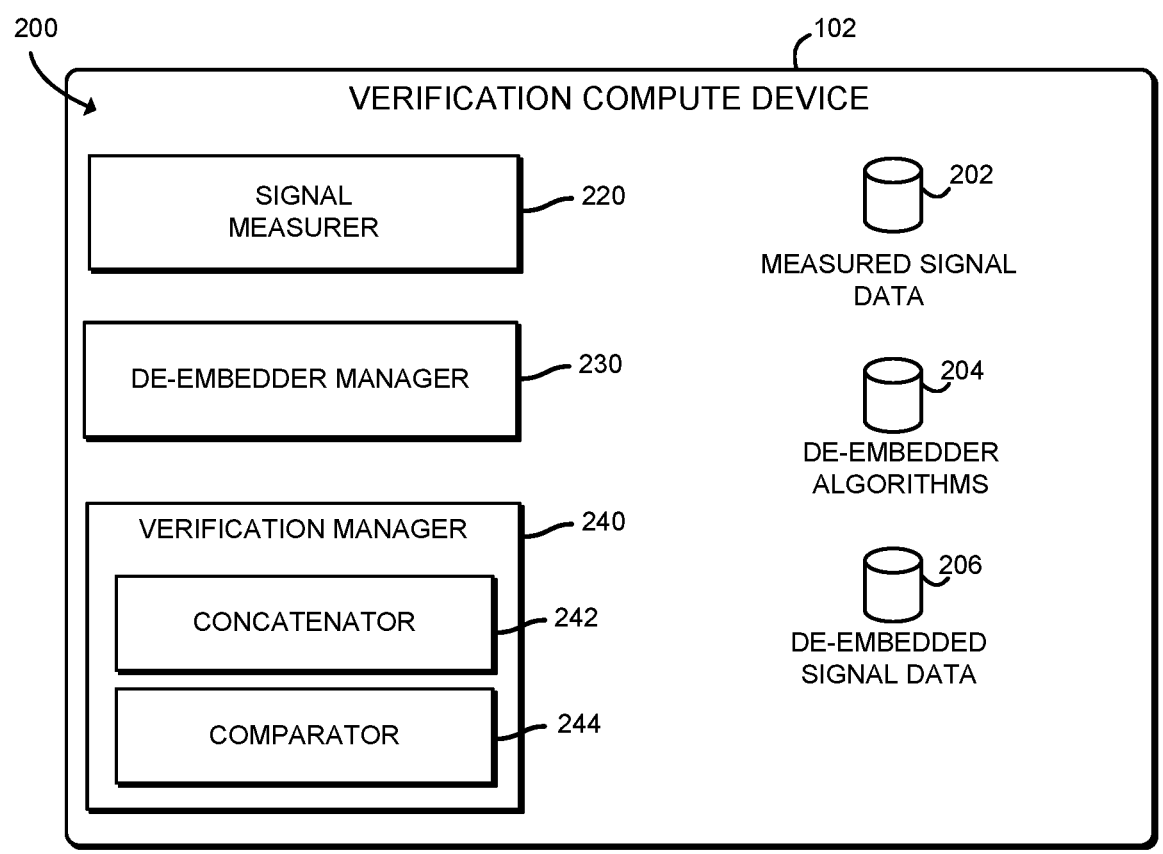
FIG. 2 is a simplified block diagram of at least one embodiment of an environment that may be established by the verification compute device of FIG. 1.

Referring now to FIG. 2, in the illustrative embodiment, the verification compute device 102 establishes an environment 200 during operation. The illustrative environment 200 includes a signal measurer 220, a de-embedder manager 230, and a verification manager 240. Each of the components of the environment 200 may be embodied as hardware, firmware, software, or a combination thereof. As such, in some embodiments, one or more of the components of the environment 200 may be embodied as circuitry or collection of electrical devices (e.g., signal measurement circuitry 220, de-embedder manager circuitry 230, verification manager circuitry 240, etc.). It should be appreciated that, in such embodiments, one or more of the signal measurement circuitry 220, the de-embedder circuitry 230, and the verification manager circuitry 240 may form a portion of one or more of the processor 104, the signal measurement devices 110, the de-embedders 120, and/or other components of the verification compute device 102. In the illustrative environment 200, the verification compute device 102 includes measured signal data 202 which may be embodied as any data indicative of properties of signals transmitted through one or more DUTs 140. For example, the measured signal data 202 may be embodied as measurements of an initial strength of a signal before it is transmitted through one or more DUTs 140, measurements of signal loss, and/or measurements of signal reflection at various frequencies. The illustrative environment 200 additionally includes de-embedder algorithms 204 which may be embodied as any data indicative of operations to be performed by one or more devices (e.g., one or more de-embedders 120) to remove an effect of one or more fixtures (e.g., the test fixtures 152, 154) from a measured signal (e.g., the measured signal data 202). Additionally, the illustrative environment 200 includes de-embedded signal data 206 which may be embodied as any data indicative of properties of a measured signal after a de-embedder 120 has applied a de-embedder algorithm 204 to the measured signal to remove the effects of the test fixtures 152, 154 on the measured signal. Each of the measured signal data 202, the de-embedder algorithms 204, and the de-embedded signal data 206 may be accessed by the various components and/or sub-components of the verification compute device 102. It should be appreciated that the verification compute device 102 may include other components, sub-components, and/or devices commonly found in a compute device, which are not illustrated in FIG. 2 for clarity of the description.

The signal measurer 220, which may be embodied as hardware, firmware, software, virtualized hardware, emulated architecture, and/or a combination thereof as discussed above, is configured to generate a test electrical signal, transmit the electrical signal through one or more DUTs 140 of the test kit 130 using the test fixtures 150, and measure the properties of signals. In the illustrative embodiment, the signal measurer 220 is configured to measure an amount of signal loss and an amount of signal reflection when the electrical signal is transmitted through the one or more DUTs 140. Further, in the illustrative embodiment, the signal measurer 220 is configured to format the measurements of the signal (e.g., the signal loss and signal reflection) as complex numbers having a real component and an imaginary component, such as S-parameters. The signal measurer 220 may be configured to generate separate measurements (i.e., signal loss and signal reflection) for each of multiple frequencies, such as a direct current (DC) signal (i.e., zero frequency), 10 GHz, 20 GHz, etc.

The de-embedder manager 230, which may be embodied as hardware, firmware, software, virtualized hardware, emulated architecture, and/or a combination thereof as discussed above, is configured to apply a de-embedder 120 to a measured signal (i.e., represented in the measured signal data 202) to modify the characteristics of the signal, thereby creating a de-embedded signal, represented in the de-embedded signal data 206. Further, the de-embedder manager 230 may be configured to select from multiple de-embedders 120 and apply each them until the verification manager 240, discussed below, determines that one of the de-embedders 120 is verified (i.e., correctly removing the effects of the test fixtures 150 from the measured signal) or that none of the de-embedders 120 are verified. In at least some embodiments, the de-embedder manager 230 selects and executes a de-embedder algorithm 204 to apply a de-embedder 120 to a measured signal. In other embodiments, the de-embedders 120 are hardware components selected by the de-embedder manager 230 to receive and modify the measured signal.

The verification manager 240, which may be embodied as hardware, firmware, software, virtualized hardware, emulated architecture, and/or a combination thereof as discussed above, is configured to verify whether a selected de-embedder 120 correctly removes the effect of the test fixtures 150 from the measured test signal. To do so, the illustrative verification manager 240 includes a concatenator 242 and a comparator 244. The illustrative concatenator 242 is configured to concatenate de-embedded signal data 206 with itself, to create concatenated de-embedded signal data 206. To do so, the illustrative concatenator 242 may apply a mathematical rule known as Mason's rule. The illustrative comparator 244 is configured to compare concatenated de-embedded signal data 206 associated with a single DUT 140 to de-embedded signal data 206 associated with two DUTs 140 that are connected in series. If the concatenated de-embedded signal data 206 matches (e.g., is equal to or within a predefined range of) the de-embedded signal data 206 associated with the two DUTs 140, then the comparator 244 is configured to determine that the de-embedder 120 used to generate the de-embedded signals is correctly removing the effect of the test fixtures 150 (i.e., that the de-embedder 120 is verified). It should be appreciated that each of the concatenator 242 and the comparator 244 of the verification manager 240 may be separately embodied as hardware, firmware, software, virtualized hardware, emulated architecture, and/or a combination thereof. For example, the concatenator 242 may be embodied as a hardware component, while the comparator 244 is embodied as a virtualized hardware component or as some other combination of hardware, firmware, software, virtualized hardware, emulated architecture, and/or a combination thereof.

Figure 3:
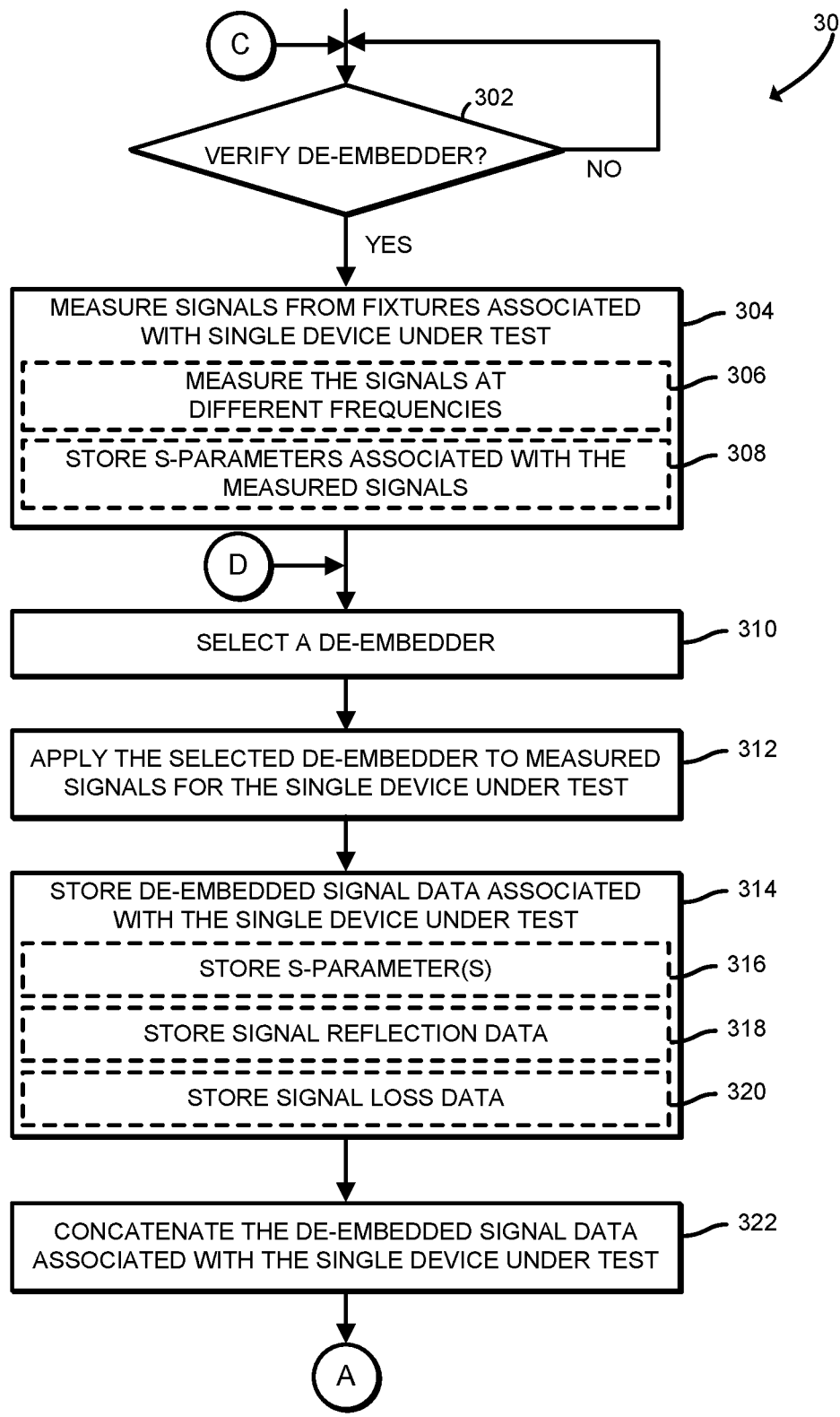
FIGS. 3-5 are a simplified flow diagram of at least one embodiment of a method for verifying a de-embedder that may be performed by the verification compute device of FIG. 1.

Referring now to FIG. 3, in use, the verification compute device 102 may execute a method 300 for verifying a de-embedder 120. The method 300 begins in block 302 in which the verification compute device 102 determines whether a request to verify a de-embedder has been received. For example, the illustrative verification compute device 102 may receive the request through a graphical user interface (not shown) presented on the display 114. In other embodiments, the signal measurement device 110 may generate the request upon detecting that the signal measurement device 110 has been coupled to the test fixtures 150. In yet other embodiments, the verification compute device 102 may receive the request from a different source. Regardless, if the verification compute device 102 determines that the request has been received, the method 300 advances to block 304. In block 304, the verification compute device 102 measures signals from the test fixtures 150 associated with a single DUT 140 included in the test kit 130. In the illustrative embodiment, the verification compute device 102 generates the signal and transmits the signal to one of the test fixtures 150 (e.g., the test fixture 152) and receives the signal at the other test fixture (e.g., the test fixture 154). A portion of the signal may be reflected back to the test fixture 152. Accordingly, the verification compute device 102 may measure this reflected portion of the signal as well. As described above, the test fixtures 150 affect the signal such that the transmission properties of the DUT 140 itself are obscured. As indicated in block 306, in measuring the signals, the verification compute device 102 may measure the signals at different frequencies, such as by sequentially generating signals over a range of frequencies, (e.g., zero to 20 gigahertz), transmitting the signals to the test fixture 152, and receiving and measuring the signals at the test fixtures 152, 154. As indicated in block 308, the verification compute device 102 may store S-parameters (e.g., complex numbers with real components and imaginary components) indicative of properties of the measured signals, such as signal loss and signal reflection, in the measured signal data 202.

In block 310, the illustrative verification compute device 102 selects a de-embedder 120. In the illustrative embodiment, there may be multiple de-embedders 120 to select from, such as various hardware devices, software algorithms (e.g., the de-embedder algorithms 204), firmware, or combinations thereof. In other embodiments, there is only one de-embedder 120 to select. In block 312, the verification compute device 102 applies the selected de-embedder 120 to the measured signals (i.e., the signal received at the test fixture 154, after it has passed through the DUT 140, and a reflected signal received at the test fixture 152). The de-embedder 120 modifies the measured signals to remove the effect of the test fixtures 150, so that only the transmission properties of the DUT 140 are represented in the resulting de-embedded signals (e.g., in the de-embedded signal data 206). In block 314, the verification compute device 102 stores the de-embedded signal data 206. In the illustrative embodiment, the verification compute device 102 stores the de-embedded signal data 206 associated with the single DUT 140 in one or more of the main memory 106 or the data storage device 112. As indicated in block 316, in storing the de-embedded signal data 206, the illustrative verification compute device 102 may store complex numbers having a real component representing a magnitude and an imaginary component representing an angle, such as one or more S-parameters. As indicated in block 318, the verification compute device 102 may store signal reflection data, representing a portion of the test signal that was reflected back to the test fixture 152. Additionally or alternatively, as indicated in block 320, the verification compute device 102 may store signal loss data, representing a portion of the test signal that was lost (i.e., the difference between the magnitude of the signal when it entered the test fixture 152 and the magnitude of the signal when it exited the test fixture 154). In block 322, the verification compute device 102 concatenates the de-embedded signal data 206 with itself to generate concatenated de-embedded signal data 206. In doing so, the verification compute device 102 may concatenate the de-embedded signal data 206 with itself using Mason's rule. The performance of blocks 304 through 322 represents a first stage of the method 300 for verifying a de-embedder 120. Subsequently, the method 300 advances to block 324 of FIG. 4, in which the verification compute device 102 begins a second stage of the method 300.

Figure 4:
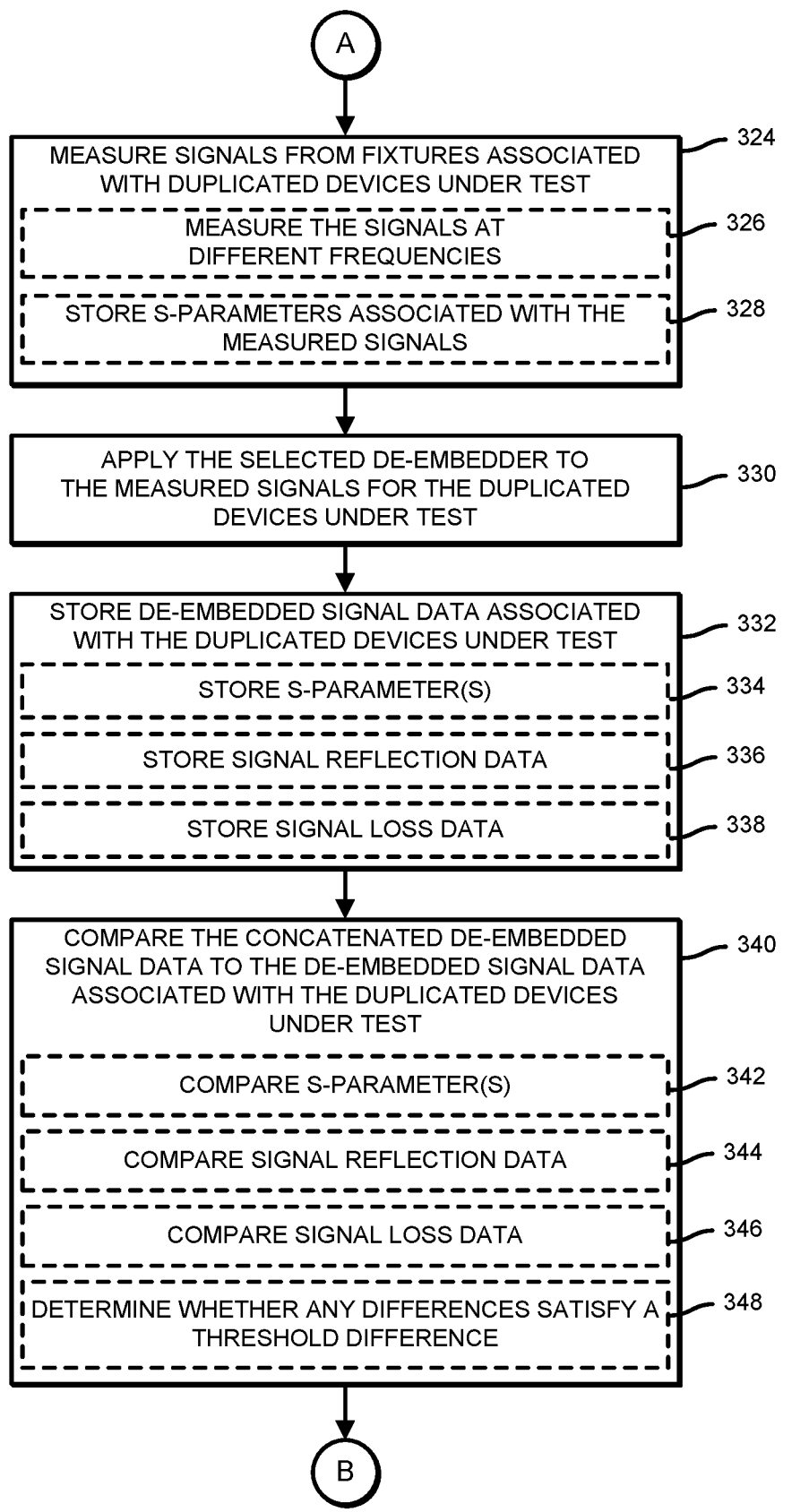

Referring now to FIG. 4, in block 324, the verification compute device 102 measures signals associated with the second stage of the method 300, in which the test kit 130 includes two DUTs 140 that are substantially identical to each other (i.e., duplicated) and to the DUT 140 used in the first stage of the method 300. The DUTs 140 used in the second stage of the method 300 are connected in series. In block 324, the verification compute device 102 applies the previously selected de-embedder 120 to the measured signals for the duplicated DUTs 140 to generate de-embedded signal data 206. As indicated in block 326, the verification compute device 102 may measure the signals at different frequencies using a process similar to the process described in connection with block 306 of FIG. 3. Additionally or alternatively, the verification compute device 102 may store S-parameters indicative of properties of the measured signals (e.g., the signal loss and signal reflection), as indicated in block 328. In block 330, the verification compute device 102 applies the selected de-embedder 120 from block 310 of FIG. 3 to the measured signals from block 324 to remove the effect of the test fixtures 150 from the measured signals.

In block 332, the verification compute device 102 stores de-embedded signal data 206 associated with the duplicated DUTs 140 (i.e., associated with the second stage of the method 300). As described above, the verification compute device 102 may store the de-embedded signal 206 data in the main memory 106 and/or in the data storage device 112. In storing the de-embedded signal data 206, the verification compute device 102 may store complex numbers, such as S-parameters, as indicated in block 334. Further, as indicated in block 336, the verification compute device 102 may store signal reflection data, representing a portion of the signal that reflected back to the test fixture 152. Additionally or alternatively, as indicated in block 338, the verification compute device 102 may store signal loss data, representing a decrease in the magnitude of the signal when it passed through the duplicated DUTs 140. The performance of blocks 324 through 338 represents a second stage of the method 300.

In block 340, the verification compute device 102 compares the concatenated de-embedded signal data 206 from block 314 of FIG. 3 with the de-embedded signal data 206 associated with the duplicated DUTs 140 (i.e., from block 332). As indicated in block 342, in performing the comparison, the verification compute device 102 may compare S-parameters representing various characteristics of the two sets of de-embedded signal data (i.e., the concatenated de-embedded signal data and the de-embedded signal data associated with the duplicated DUTs 140). Further, as indicated in block 344, the verification compute device 102 may compare signal reflection data associated with the two sets of de-embedded signal data 206. As described above, the signal reflection data represents a portion of each test signal that reflected back to the test fixture 152. Additionally or alternatively, as indicated in block 346, the verification compute device 102 may compare signal loss data associated with the two sets of de-embedded signal data 206. As described above, the signal loss data represents a change in magnitude of a test signal when it passes through the one or more DUTs 140. As indicated in block 348, in comparing the sets of de-embedded signal data 206, the verification compute device 102 may determine whether corresponding components of the data sets satisfy a threshold difference. In doing so, the verification compute device 102 may determine whether the data sets are within a predefined threshold of each other (e.g., a predefined percentage such as 2%), rather than simply determining whether the data sets contain equal values. Subsequently, the method 300 advances to block 350 of FIG. 5, in which the verification compute device 102 determines whether the compared data sets match (e.g., whether the data sets contain equal values, whether the data sets are within a predefined threshold of each other, etc.).

Figure 5:
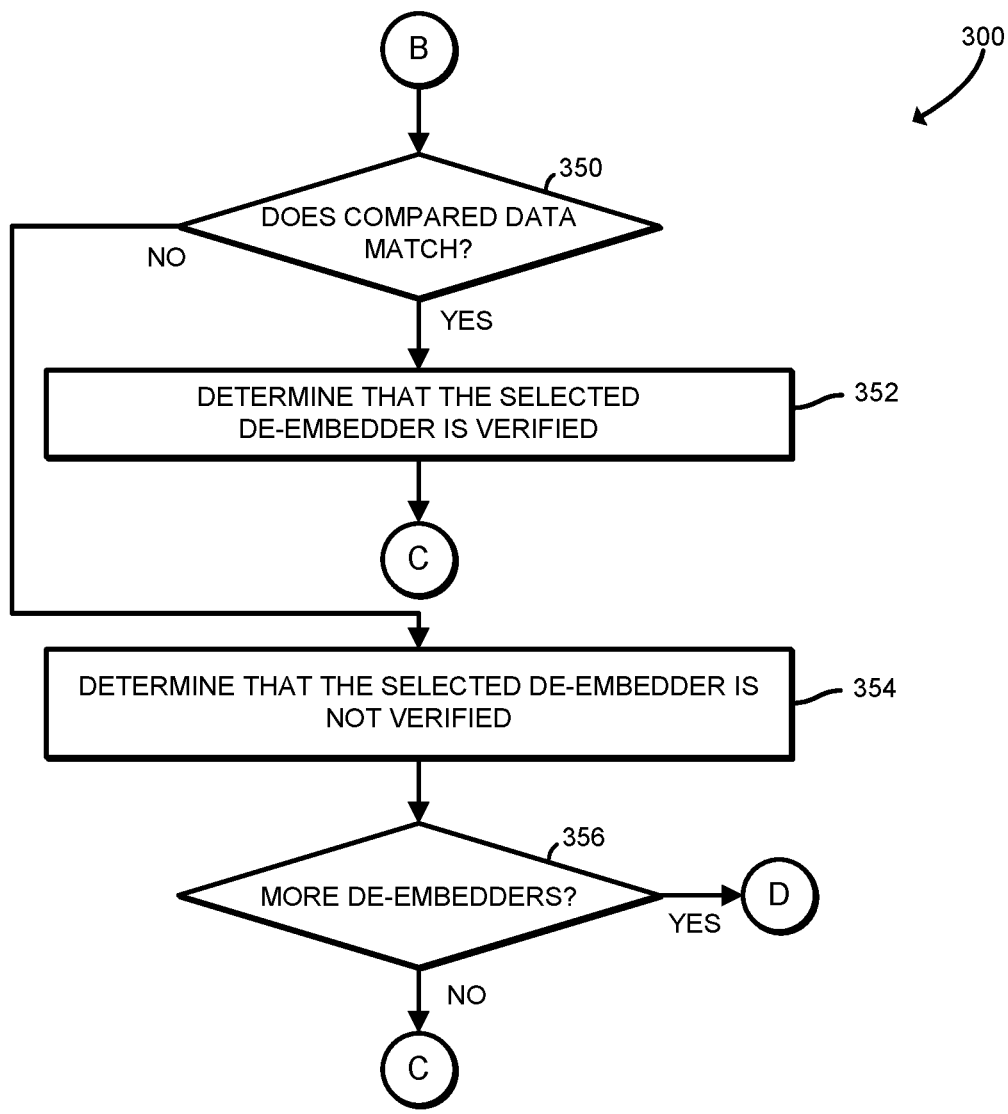

Referring now to FIG. 5, if the compared data sets match, the method 300 advances to block 352. In block 352, the verification compute device 102 determines that the selected de-embedder 120 is verified (i.e., that the de-embedder 120 correctly removed the effect of the test fixtures from the measured signals so that only the transmission properties of the DUTs 140 are represented). The method 300 may subsequently loop back to block 302 to await another request to verify a de-embedder 120. However, referring back to block 350, if the verification compute device 102 instead determines that the compared data sets do not match, the method 300 advances to block 354 of FIG. 5. In block 354, the verification compute device 102 determines that the selected de-embedder 120 is not verified. Subsequently, the method 300 advances to block 356 in which the verification compute device 102 determines whether to test another de-embedder 120. In some embodiments, the verification compute device 102 may display a prompt through the display 114, informing a user that the selected de-embedder 120 was not verified and that another de-embedder is available to be tested. In other embodiments, the verification compute device 102 may determine whether another de-embedder 120 is available to the verification compute device 102 to be tested, and if so, to proceed with testing another de-embedder 120. If the verification compute device 102 determines to test another de-embedder 120, the method 300 loops back to block 310 of FIG. 3, to select another de-embedder 120. Otherwise, the verification compute device 102 may determine that all of the available de-embedders 120 have been tested or that the user has indicated not to test another de-embedder, in which case the method 300 may loop back to block 302 to await a request to test a de-embedder 120. Blocks 340 through 356 represent a third stage of the method 300.

Figure 6:
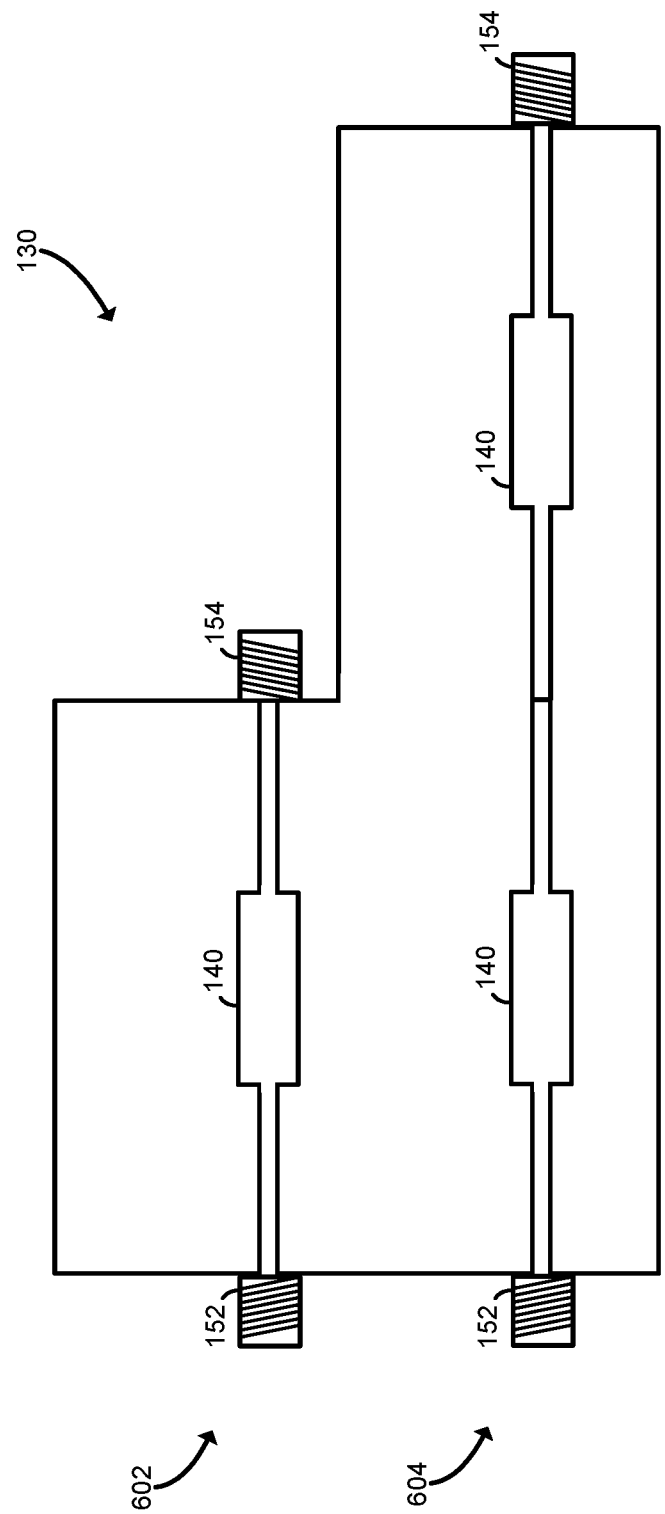
FIG. 6 is a simplified diagram of at least one embodiment of a test kit that may be used with the verification compute device of FIG. 1.

Referring now to FIG. 6, the illustrative test kit 130 may include two portions 602, 604 used for the first stage and second stages of the method 300, respectively. The portion 602 includes the test fixtures 152, 154 coupled to corresponding ends of a DUT 140. As described above, the DUT 140 is embodied as an interconnect, such as a trace on a PCB or other type of electrical conductor capable of transmitting a data signal. The portion 604 includes the test fixtures 152, 154 coupled to corresponding ends of a duplicated set of DUTs 140. The DUTs 140 are connected in series and, as described above, are substantially identical to the DUT 140 of the first portion 602. Likewise, the test fixtures 152, 154 of the second portion 604 are substantially identical to the test fixtures 152, 154 of the first portion 602.

Figure 7:
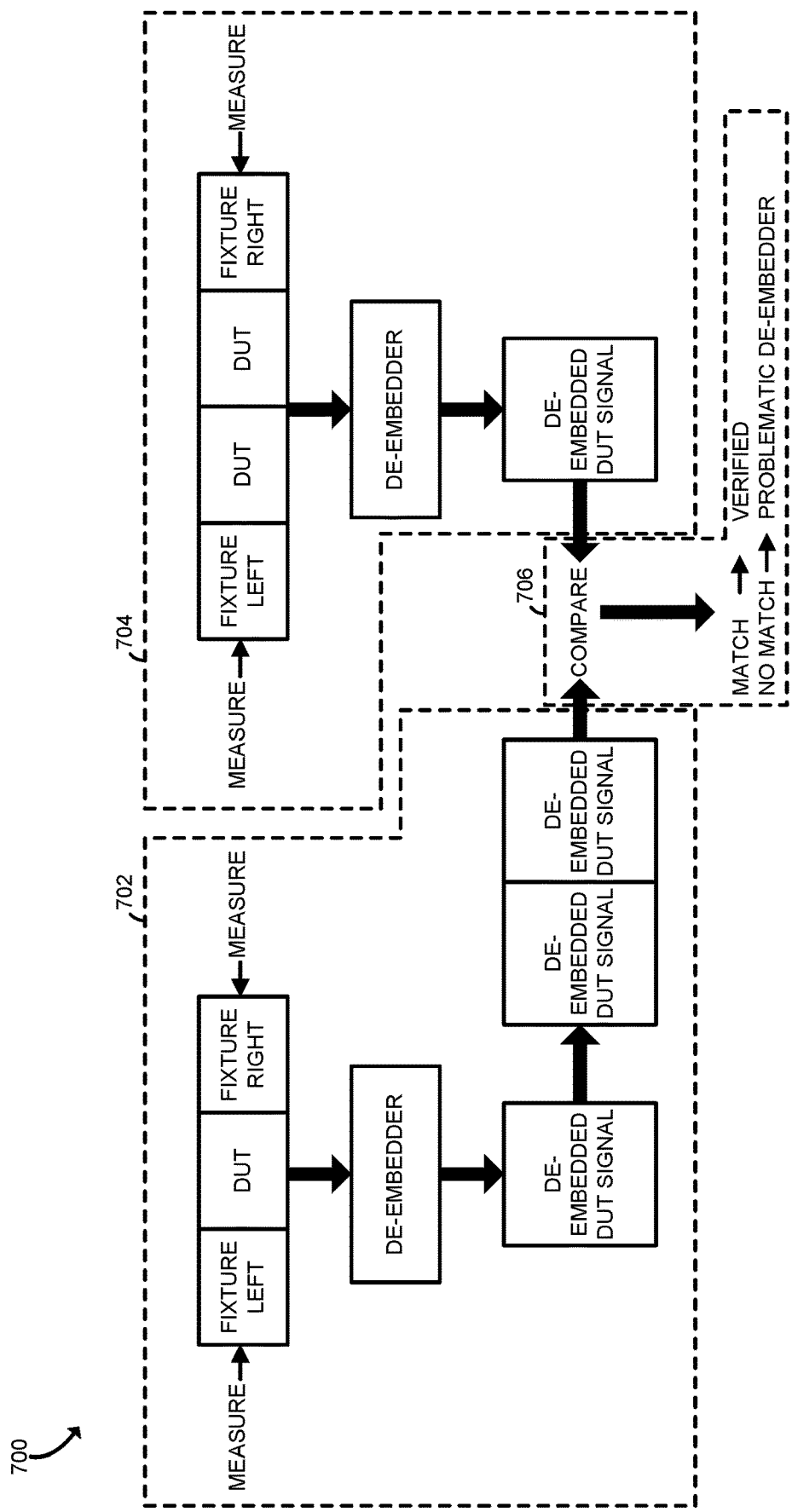
FIG. 7 is a simplified flow diagram of at least one embodiment of a method for verifying a de-embedder that may be performed by the verification compute device of FIG. 1.

Referring now to FIG. 7, a simplified flow diagram 700 illustrates the stages of the method 300 of FIGS. 3-5. The first stage 702 corresponds to blocks 304 through 322 of the method 300. The second stage 704 corresponds to blocks 324 through 338 of the method 300. As indicated in the flow diagram 700, the first stage 702 need not occur before the second stage 704. Rather, the stages 702, 704 may occur in any order, or concurrently, as long as they occur before the third stage 706. In the third stage 706, described above with reference to blocks 340 through 356 of the method 300, the verification compute device 102 compares the de-embedded signal data sets 206 associated with the stages 702, 704. The verification compute device 102 performs the comparison to determine whether the selected de-embedder 120 has correctly removed the effect of the test fixtures 150, such that the de-embedded signal data 206 represents only the transmission characteristics (e.g., S-parameters) of the DUTs 140.

EXAMPLES

Illustrative examples of the devices, systems, and methods disclosed herein are provided below. An embodiment of the devices, systems, and methods may include any one or more, and any combination of, the examples described below.

Example 1 includes a verification compute device for verifying a de-embedder, the verification compute device comprising one or more processors; one or more memory devices having stored therein a plurality of instructions that, when executed, cause the verification compute device to measure a first signal transmitted through a single device under test; measure a second signal transmitted through a duplicated set of devices under test, wherein each device under test in the duplicated set is substantially identical to the single device under test; apply a de-embedder to the measured first signal to remove an effect of test fixtures on the measured first signal; apply the de-embedder to the measured second signal to remove the effect of the test fixtures on the measured second signal; concatenate the de-embedded first signal with itself to generate a concatenated de-embedded first signal; and compare the concatenated de-embedded first signal with the de-embedded second signal to determine whether the concatenated de-embedded first signal matches the de-embedded second signal.

Example 2 includes the subject matter of Example 1, and wherein the plurality of instructions, when executed, further cause the verification compute device to determine, in response to a determination that the concatenated de-embedded first signal matches the de-embedded second signal, that the de-embedder is verified.

Example 3 includes the subject matter of any of Examples 1 and 2, and wherein the plurality of instructions, when executed, further cause the verification compute device to determine, in response to a determination that the concatenated de-embedded first signal does not match the de-embedded second signal, that the de-embedder is not verified.

Example 4 includes the subject matter of any of Examples 1-3, and wherein the de-embedder is a first de-embedder, and the plurality of instructions, when executed, further cause the verification compute device to select a second de-embedder to apply to the measured first signal and the measured second signal to remove the effects of the fixtures from the first and second measured signals.

Example 5 includes the subject matter of any of Examples 1-4, and wherein to measure the first signal comprises to measure at least one of a signal reflection or a signal loss.

Example 6 includes the subject matter of any of Examples 1-5, and wherein to compare the concatenated de-embedded first signal with the de-embedded second signal comprises to determine whether a difference between the de-embedded first signal and the de-embedded second signal satisfies a threshold difference; determine, in response to a determination that the difference satisfies the threshold difference, that the concatenated de-embedded first signal matches the de-embedded second signal; and determine, in response to a determination that the difference does not satisfy the threshold difference, that the concatenated de-embedded first signal does not match the de-embedded second signal.

Example 7 includes the subject matter of any of Examples 1-6, and wherein to measure the first signal comprises to measure a signal transmitted through the single device under test at different frequencies.

Example 8 includes the subject matter of any of Examples 1-7, and wherein to measure the second signal comprises to measure a signal transmitted through the duplicated set of devices under test at different frequencies.

Example 9 includes the subject matter of any of Examples 1-8, and wherein to measure the first signal comprises to transmit the first signal to a first test fixture coupled to one end of the single device under test; and measure a change in magnitude of the first signal at a second test fixture coupled to an opposite end of the single device under test.

Example 10 includes the subject matter of any of Examples 1-9, and wherein to measure the first signal further comprises to measure a reflection of the first signal at the first test fixture.

Example 11 includes the subject matter of any of Examples 1-10, and wherein to measure the second signal comprises to transmit the second signal to a first test fixture coupled to one end of the duplicated set of devices under test; and measure a change in magnitude of the second signal at a second test fixture coupled to an opposite end of the duplicated set of devices under test.

Example 12 includes the subject matter of any of Examples 1-11, and wherein to measure the second signal further comprises to measure a reflection of the second signal at the first test fixture.

Example 13 includes the subject matter of any of Examples 1-12, and wherein the plurality of instructions, when executed, further cause the verification compute device to store a first set of S-parameters indicative of signal loss and signal reflection associated with the first signal transmitted through the single device under test; and store a second set of S-parameters indicative of signal loss and signal reflection associated with the second signal transmitted through the duplicated set of devices under test.

Example 14 includes the subject matter of any of Examples 1-13, and wherein to apply a de-embedder to the measured first signal comprises to apply a de-embedder algorithm to the first set of S-parameters to produce a de-embedded first set of S-parameters; and wherein to apply the de-embedder to the measured second signal comprises to apply the de-embedder algorithm to the second set of S-parameters to produce a de-embedded second set of S-parameters.

Example 15 includes the subject matter of any of Examples 1-14, and wherein to compare the concatenated de-embedded first signal with the de-embedded second signal comprises to compare a first set of S-parameters indicative of properties of the concatenated de-embedded first signal with a second set of S-parameters indicative of properties of the de-embedded second signal.

Example 16 includes a method for verifying a de-embedder, the method comprising measuring, by a verification compute device, a first signal transmitted through a single device under test, measuring, by the verification compute device, a second signal transmitted through a duplicated set of devices under test, wherein each device under test in the duplicated set is substantially identical to the single device under test; applying, by the verification compute device, a de-embedder to the measured first signal to remove an effect of test fixtures on the measured first signal; applying, by the verification compute device, the de-embedder to the measured second signal to remove the effect of the test fixtures on the measured second signal; concatenating, by the verification compute device, the de-embedded first signal with itself to generate a concatenated de-embedded first signal; and comparing, by the verification compute device, the concatenated de-embedded first signal with the de-embedded second signal to determine whether the concatenated de-embedded first signal matches the de-embedded second signal.

Example 17 includes the subject matter of Example 16, and further including determining, by the verification compute device and in response to a determination that the concatenated de-embedded first signal matches the de-embedded second signal, that the de-embedder is verified.

Example 18 includes the subject matter of any of Examples 16 and 17, and further including determining, by the verification compute device and in response to a determination that the concatenated de-embedded first signal does not match the de-embedded second signal, that the de-embedder is not verified.

Example 19 includes the subject matter of any of Examples 16-18, and wherein the de-embedder is a first de-embedder, the method further comprising selecting, by the verification compute device, a second de-embedder to apply to the measured first signal and the measured second signal to remove the effects of the fixtures from the first and second measured signals.

Example 20 includes the subject matter of any of Examples 16-19, and wherein measuring the first signal comprises measuring at least one of a signal reflection or a signal loss.

Example 21 includes the subject matter of any of Examples 16-20, and wherein comparing the concatenated de-embedded first signal with the de-embedded second signal comprises determining whether a difference between the de-embedded first signal and the de-embedded second signal satisfies a threshold difference; determining, in response to a determination that the difference satisfies the threshold difference, that the concatenated de-embedded first signal matches the de-embedded second signal; and determining, in response to a determination that the difference does not satisfy the threshold difference, that the concatenated de-embedded first signal does not match the de-embedded second signal.

Example 22 includes the subject matter of any of Examples 16-21, and wherein measuring the first signal comprises measuring a signal transmitted through the single device under test at different frequencies.

Example 23 includes the subject matter of any of Examples 16-22, and wherein measuring the second signal comprises measuring a signal transmitted through the duplicated set of devices under test at different frequencies.

Example 24 includes the subject matter of any of Examples 16-23, and wherein measuring the first signal comprises transmitting the first signal to a first test fixture coupled to one end of the single device under test; and measuring a change in magnitude of the first signal at a second test fixture coupled to an opposite end of the single device under test.

Example 25 includes the subject matter of any of Examples 16-24, and wherein measuring the first signal further comprises measuring a reflection of the first signal at the first test fixture.

Example 26 includes the subject matter of any of Examples 16-25, and wherein measuring the second signal comprises transmitting the second signal to a first test fixture coupled to one end of the duplicated set of devices under test; and measuring a change in magnitude of the second signal at a second test fixture coupled to an opposite end of the duplicated set of devices under test.

Example 27 includes the subject matter of any of Examples 16-26, and wherein measuring the second signal further comprises measuring a reflection of the second signal at the first test fixture.

Example 28 includes the subject matter of any of Examples 16-27, and further including storing, by the verification compute device, a first set of S-parameters indicative of signal loss and signal reflection associated with the first signal transmitted through the single device under test; and storing, by the verification compute device, a second set of S-parameters indicative of signal loss and signal reflection associated with the second signal transmitted through the duplicated set of devices under test.

Example 29 includes the subject matter of any of Examples 16-28, and wherein applying a de-embedder to the measured first signal comprises applying a de-embedder algorithm to the first set of S-parameters to produce a de-embedded first set of S-parameters; and wherein applying the de-embedder to the measured second signal comprises applying the de-embedder algorithm to the second set of S-parameters to produce a de-embedded second set of S-parameters.

Example 30 includes the subject matter of any of Examples 16-29, and wherein comparing the concatenated de-embedded first signal with the de-embedded second signal comprises comparing a first set of S-parameters indicative of properties of the concatenated de-embedded first signal with a second set of S-parameters indicative of properties of the de-embedded second signal.

Example 31 includes one or more computer-readable storage media comprising a plurality of instructions that, in response to being executed, cause a verification compute device to perform the method of any of Examples 16-30.

Example 32 includes a verification compute device for verifying a de-embedder, the verification compute device comprising one or more processors; one or more memory devices having stored therein a plurality of instructions that, when executed, cause the verification compute device to perform the method of any of Examples 16-30.

Example 33 includes a verification compute device for verifying a de-embedder, the verification compute device comprising means for performing the method of any of Examples 16-30.

Example 34 includes a verification compute device for verifying a de-embedder, the verification compute device comprising signal measurer circuitry to measure a first signal transmitted through a single device under test, and measure a second signal transmitted through a duplicated set of devices under test, wherein each device under test in the duplicated set is substantially identical to the single device under test; de-embedder manager circuitry to apply a de-embedder to the measured first signal to remove an effect of test fixtures on the measured first signal and apply the de-embedder to the measured second signal to remove the effect of the test fixtures on the measured second signal; and a verification manager circuitry to concatenate the de-embedded first signal with itself to generate a concatenated de-embedded first signal, and compare the concatenated de-embedded first signal with the de-embedded second signal to determine whether the concatenated de-embedded first signal matches the de-embedded second signal.

Example 35 includes the subject matter of Example 34, and wherein the verification manager circuitry is further to determine, in response to a determination that the concatenated de-embedded first signal matches the de-embedded second signal, that the de-embedder is verified.

Example 36 includes the subject matter of any of Examples 34 and 35, and wherein the verification manager circuitry is further to determine, in response to a determination that the concatenated de-embedded first signal does not match the de-embedded second signal, that the de-embedder is not verified.

Example 37 includes the subject matter of any of Examples 34-36, and wherein the de-embedder is a first de-embedder, and the de-embedder manager circuitry is further to select a second de-embedder to apply to the measured first signal and the measured second signal to remove the effects of the fixtures from the first and second measured signals.

Example 38 includes the subject matter of any of Examples 34-37, and wherein to measure the first signal comprises to measure at least one of a signal reflection or a signal loss.

Example 39 includes the subject matter of any of Examples 34-38, and wherein to compare the concatenated de-embedded first signal with the de-embedded second signal comprises to determine whether a difference between the de-embedded first signal and the de-embedded second signal satisfies a threshold difference; determine, in response to a determination that the difference satisfies the threshold difference, that the concatenated de-embedded first signal matches the de-embedded second signal; and determine, in response to a determination that the difference does not satisfy the threshold difference, that the concatenated de-embedded first signal does not match the de-embedded second signal.

Example 40 includes the subject matter of any of Examples 34-39, and wherein to measure the first signal comprises to measure a signal transmitted through the single device under test at different frequencies.

Example 41 includes the subject matter of any of Examples 34-40, and wherein to measure the second signal comprises to measure a signal transmitted through the duplicated set of devices under test at different frequencies.

Example 42 includes the subject matter of any of Examples 34-41, and wherein to measure the first signal comprises to transmit the first signal to a first test fixture coupled to one end of the single device under test; and measure a change in magnitude of the first signal at a second test fixture coupled to an opposite end of the single device under test.

Example 43 includes the subject matter of any of Examples 34-42, and wherein to measure the first signal further comprises to measure a reflection of the first signal at the first test fixture.

Example 44 includes the subject matter of any of Examples 34-43, and wherein to measure the second signal comprises to transmit the second signal to a first test fixture coupled to one end of the duplicated set of devices under test; and measure a change in magnitude of the second signal at a second test fixture coupled to an opposite end of the duplicated set of devices under test.

Example 45 includes the subject matter of any of Examples 34-44, and wherein to measure the second signal further comprises to measure a reflection of the second signal at the first test fixture.

Example 46 includes the subject matter of any of Examples 34-45, and wherein the signal measurer circuitry is further to store a first set of S-parameters indicative of signal loss and signal reflection associated with the first signal transmitted through the single device under test; and store a second set of S-parameters indicative of signal loss and signal reflection associated with the second signal transmitted through the duplicated set of devices under test.

Example 47 includes the subject matter of any of Examples 34-46, and wherein to apply a de-embedder to the measured first signal comprises to apply a de-embedder algorithm to the first set of S-parameters to produce a de-embedded first set of S-parameters; and wherein to apply the de-embedder to the measured second signal comprises to apply the de-embedder algorithm to the second set of S-parameters to produce a de-embedded second set of S-parameters.

Example 48 includes the subject matter of any of Examples 34-47, and wherein to compare the concatenated de-embedded first signal with the de-embedded second signal comprises to compare a first set of S-parameters indicative of properties of the concatenated de-embedded first signal with a second set of S-parameters indicative of properties of the de-embedded second signal.

Example 49 includes a verification compute device for verifying a de-embedder, the verification compute device comprising circuitry for measuring a first signal transmitted through a single device under test, circuitry for measuring a second signal transmitted through a duplicated set of devices under test, wherein each device under test in the duplicated set is substantially identical to the single device under test; circuitry for applying, by the verification compute device, a de-embedder to the measured first signal to remove an effect of test fixtures on the measured first signal; circuitry for applying, by the verification compute device, the de-embedder to the measured second signal to remove the effect of the test fixtures on the measured second signal; means for concatenating, by the verification compute device, the de-embedded first signal with itself to generate a concatenated de-embedded first signal; and means for comparing the concatenated de-embedded first signal with the de-embedded second signal to determine whether the concatenated de-embedded first signal matches the de-embedded second signal.

Example 50 includes the subject matter of Example 49, and further including circuitry for determining, in response to a determination that the concatenated de-embedded first signal matches the de-embedded second signal, that the de-embedder is verified.

Example 51 includes the subject matter of any of Examples 49 and 50, and further including circuitry for determining, in response to a determination that the concatenated de-embedded first signal does not match the de-embedded second signal, that the de-embedder is not verified.

Example 52 includes the subject matter of any of Examples 49-51, and wherein the de-embedder is a first de-embedder, the verification compute device further comprising circuitry for selecting a second de-embedder to apply to the measured first signal and the measured second signal to remove the effects of the fixtures from the first and second measured signals.

Example 53 includes the subject matter of any of Examples 49-52, and wherein the circuitry for measuring the first signal comprises circuitry for measuring at least one of a signal reflection or a signal loss.

Example 54 includes the subject matter of any of Examples 49-53, and wherein the means for comparing the concatenated de-embedded first signal with the de-embedded second signal comprises circuitry for determining whether a difference between the de-embedded first signal and the de-embedded second signal satisfies a threshold difference; circuitry for determining, in response to a determination that the difference satisfies the threshold difference, that the concatenated de-embedded first signal matches the de-embedded second signal; and circuitry for determining, in response to a determination that the difference does not satisfy the threshold difference, that the concatenated de-embedded first signal does not match the de-embedded second signal.

Example 55 includes the subject matter of any of Examples 49-54, and wherein the circuitry for measuring the first signal comprises circuitry for measuring a signal transmitted through the single device under test at different frequencies.

Example 56 includes the subject matter of any of Examples 49-55, and wherein the circuitry for measuring the second signal comprises circuitry for measuring a signal transmitted through the duplicated set of devices under test at different frequencies.

Example 57 includes the subject matter of any of Examples 49-56, and wherein the circuitry for measuring the first signal comprises circuitry for transmitting the first signal to a first test fixture coupled to one end of the single device under test; and circuitry for measuring a change in magnitude of the first signal at a second test fixture coupled to an opposite end of the single device under test.

Example 58 includes the subject matter of any of Examples 49-57, and wherein the circuitry for measuring the first signal further comprises circuitry for measuring a reflection of the first signal at the first test fixture.

Example 59 includes the subject matter of any of Examples 49-58, and wherein the circuitry for measuring the second signal comprises circuitry for transmitting the second signal to a first test fixture coupled to one end of the duplicated set of devices under test; and circuitry for measuring a change in magnitude of the second signal at a second test fixture coupled to an opposite end of the duplicated set of devices under test.

Example 60 includes the subject matter of any of Examples 49-59, and wherein the circuitry for measuring the second signal further comprises circuitry for measuring a reflection of the second signal at the first test fixture.

Example 61 includes the subject matter of any of Examples 49-60, and further including circuitry for storing a first set of S-parameters indicative of signal loss and signal reflection associated with the first signal transmitted through the single device under test; and circuitry for storing a second set of S-parameters indicative of signal loss and signal reflection associated with the second signal transmitted through the duplicated set of devices under test.

Example 62 includes the subject matter of any of Examples 49-61, and wherein the circuitry for applying a de-embedder to the measured first signal comprises circuitry for applying a de-embedder algorithm to the first set of S-parameters to produce a de-embedded first set of S-parameters; and wherein the circuitry for applying the de-embedder to the measured second signal comprises circuitry for applying the de-embedder algorithm to the second set of S-parameters to produce a de-embedded second set of S-parameters.

Example 63 includes the subject matter of any of Examples 49-62, and wherein the means for comparing the concatenated de-embedded first signal with the de-embedded second signal comprises means for comparing a first set of S-parameters indicative of properties of the concatenated de-embedded first signal with a second set of S-parameters indicative of properties of the de-embedded second signal.

The invention claimed is:

1. A verification compute device for verifying a de-embedder, the verification compute device comprising:
one or more processors;
one or more memory devices having stored therein a plurality of instructions that, when executed, cause the verification compute device to:
measure a first signal transmitted through a single device under test;
measure a second signal transmitted through a duplicated set of devices under test, wherein each device under test in the duplicated set is substantially identical to the single device under test;
apply a de-embedder to the measured first signal to remove an effect of test fixtures on the measured first signal;
apply the de-embedder to the measured second signal to remove the effect of the test fixtures on the measured second signal;
concatenate the de-embedded first signal with itself to generate a concatenated de-embedded first signal; and
compare the concatenated de-embedded first signal with the de-embedded second signal to determine whether the concatenated de-embedded first signal matches the de-embedded second signal.

2. The verification compute device of claim 1, wherein the plurality of instructions, when executed, further cause the verification compute device to determine, in response to a determination that the concatenated de-embedded first signal matches the de-embedded second signal, that the de-embedder is verified.

3. The verification compute device of claim 1, wherein the plurality of instructions, when executed, further cause the verification compute device to determine, in response to a determination that the concatenated de-embedded first signal does not match the de-embedded second signal, that the de-embedder is not verified.

4. The verification compute device of claim 3, wherein the de-embedder is a first de-embedder, and the plurality of instructions, when executed, further cause the verification compute device to select a second de-embedder to apply to the measured first signal and the measured second signal to remove the effects of the fixtures from the first and second measured signals.

5. The verification compute device of claim 1, wherein to measure the first signal comprises to measure at least one of a signal reflection or a signal loss.

6. The verification compute device of claim 1, wherein to compare the concatenated de-embedded first signal with the de-embedded second signal comprises to:
determine whether a difference between the de-embedded first signal and the de-embedded second signal satisfies a threshold difference;
determine, in response to a determination that the difference satisfies the threshold difference, that the concatenated de-embedded first signal matches the de-embedded second signal; and
determine, in response to a determination that the difference does not satisfy the threshold difference, that the concatenated de-embedded first signal does not match the de-embedded second signal.

7. The verification compute device of claim 1, wherein to measure the first signal comprises to measure a signal transmitted through the single device under test at different frequencies.

8. The verification compute device of claim 1, wherein to measure the second signal comprises to measure a signal transmitted through the duplicated set of devices under test at different frequencies.

9. The verification compute device of claim 1, wherein to measure the first signal comprises to:
transmit the first signal to a first test fixture coupled to one end of the single device under test; and
measure a change in magnitude of the first signal at a second test fixture coupled to an opposite end of the single device under test.

10. The verification compute device of claim 9, wherein to measure the first signal further comprises to measure a reflection of the first signal at the first test fixture.

11. The verification compute device of claim 1, wherein to measure the second signal comprises to:
transmit the second signal to a first test fixture coupled to one end of the duplicated set of devices under test; and
measure a change in magnitude of the second signal at a second test fixture coupled to an opposite end of the duplicated set of devices under test.

12. The verification compute device of claim 11, wherein to measure the second signal further comprises to measure a reflection of the second signal at the first test fixture.

13. The verification compute device of claim 1, wherein the plurality of instructions, when executed, further cause the verification compute device to:
store a first set of S-parameters indicative of signal loss and signal reflection associated with the first signal transmitted through the single device under test; and
store a second set of S-parameters indicative of signal loss and signal reflection associated with the second signal transmitted through the duplicated set of devices under test.

14. One or more non-transitory computer-readable storage media comprising a plurality of instructions that, in response to being executed, cause a verification compute device to:
measure a first signal transmitted through a single device under test;
measure a second signal transmitted through a duplicated set of devices under test, wherein each device under test in the duplicated set is substantially identical to the single device under test;
apply a de-embedder to the measured first signal to remove an effect of test fixtures on the measured first signal;

apply the de-embedder to the measured second signal to remove the effect of the test fixtures on the measured second signal;

concatenate the de-embedded first signal with itself to generate a concatenated de-embedded first signal; and compare the concatenated de-embedded first signal with the de-embedded second signal to determine whether the concatenated de-embedded first signal matches the de-embedded second signal.

15. The one or more non-transitory computer-readable storage media of claim 14, wherein the plurality of instructions, when executed, further cause the verification compute device to determine, in response to a determination that the concatenated de-embedded first signal matches the de-embedded second signal, that the de-embedder is verified.

16. The one or more non-transitory computer-readable storage media of claim 14, wherein the plurality of instructions, when executed, further cause the verification compute device to determine, in response to a determination that the concatenated de-embedded first signal does not match the de-embedded second signal, that the de-embedder is not verified.

17. The one or more non-transitory computer-readable storage media of claim 16, wherein the de-embedder is a first de-embedder, and the plurality of instructions, when executed, further cause the verification compute device to select a second de-embedder to apply to the measured first signal and the measured second signal to remove the effects of the fixtures from the first and second measured signals.

18. The one or more non-transitory computer-readable storage media of claim 14, wherein to measure the first signal comprises to measure at least one of a signal reflection or a signal loss.

19. The one or more non-transitory computer-readable storage media of claim 14, wherein to compare the concatenated de-embedded first signal with the de-embedded second signal comprises to:

determine whether a difference between the de-embedded first signal and the de-embedded second signal satisfies a threshold difference;

determine, in response to a determination that the difference satisfies the threshold difference, that the concatenated de-embedded first signal matches the de-embedded second signal; and determine, in response to a determination that the difference does not satisfy the threshold difference, that the concatenated de-embedded first signal does not match the de-embedded second signal.

20. The one or more non-transitory computer-readable storage media of claim 14, wherein to measure the first signal comprises to measure a signal transmitted through the single device under test at different frequencies.

21. The one or more non-transitory computer-readable storage media of claim 14, wherein to measure the second signal comprises to measure a signal transmitted through the duplicated set of devices under test at different frequencies.

22. The one or more non-transitory computer-readable storage media of claim 14, wherein to measure the first signal comprises to:

transmit the first signal to a first test fixture coupled to one end of the single device under test; and measure a change in magnitude of the first signal at a second test fixture coupled to an opposite end of the single device under test.

23. The one or more non-transitory computer-readable storage media of claim 22, wherein to measure the first signal further comprises to measure a reflection of the first signal at the first test fixture.

24. The one or more non-transitory computer-readable storage media of claim 14, wherein to measure the second signal comprises to:

transmit the second signal to a first test fixture coupled to one end of the duplicated set of devices under test; and measure a change in magnitude of the second signal at a second test fixture coupled to an opposite end of the duplicated set of devices under test.

25. A verification compute device for verifying a de-embedder, the verification compute device comprising:

circuitry for measuring a first signal transmitted through a single device under test;

circuitry for measuring a second signal transmitted through a duplicated set of devices under test, wherein each device under test in the duplicated set is substantially identical to the single device under test;

circuitry for applying, by the verification compute device, a de-embedder to the measured first signal to remove an effect of test fixtures on the measured first signal;

circuitry for applying, by the verification compute device, the de-embedder to the measured second signal to remove the effect of the test fixtures on the measured second signal;

means for concatenating, by the verification compute device, the de-embedded first signal with itself to generate a concatenated de-embedded first signal; and means for comparing the concatenated de-embedded first signal with the de-embedded second signal to determine whether the concatenated de-embedded first signal matches the de-embedded second signal.

26. A method for verifying a de-embedder, the method comprising:

measuring, by a verification compute device, a first signal transmitted through a single device under test;

measuring, by the verification compute device, a second signal transmitted through a duplicated set of devices under test, wherein each device under test in the duplicated set is substantially identical to the single device under test;

applying, by the verification compute device, a de-embedder to the measured first signal to remove an effect of test fixtures on the measured first signal;

applying, by the verification compute device, the de-embedder to the measured second signal to remove the effect of the test fixtures on the measured second signal;

concatenating, by the verification compute device, the de-embedded first signal with itself to generate a concatenated de-embedded first signal; and comparing, by the verification compute device, the concatenated de-embedded first signal with the de-embedded second signal to determine whether the concatenated de-embedded first signal matches the de-embedded second signal.

27. The method of claim 26, further comprising determining, by the verification compute device and in response to a determination that the concatenated de-embedded first signal matches the de-embedded second signal, that the de-embedder is verified.

28. The method of claim 26, further comprising determining, by the verification compute device and in response to a determination that the concatenated de-embedded first signal does not match the de-embedded second signal, that the de-embedder is not verified.

* * * * *